(12) United States Patent
Yun

(10) Patent No.: US 12,120,835 B2
(45) Date of Patent: Oct. 15, 2024

(54) DISPLAY APPARATUS

(71) Applicant: LG Display Co., Ltd., Seoul (KR)

(72) Inventor: Junho Yun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 207 days.

(21) Appl. No.: 17/992,611

(22) Filed: Nov. 22, 2022

(65) Prior Publication Data

US 2023/0209755 A1   Jun. 29, 2023

(30) Foreign Application Priority Data

Dec. 28, 2021   (KR) .......................... 10-2021-0189139

(51) Int. Cl.
*H05K 5/03*   (2006.01)
(52) U.S. Cl.
CPC ..................................... *H05K 5/03* (2013.01)
(58) Field of Classification Search
CPC ....................................................... H05K 5/03
USPC ......................................................... 428/192
See application file for complete search history.

(56) References Cited

U.S. PATENT DOCUMENTS

| | | | |
|---|---|---|---|
| 2014/0002385 A1* | 1/2014 | Ka | H10K 59/131 345/173 |
| 2017/0265340 A1* | 9/2017 | Son | H05K 13/00 |
| 2018/0120494 A1* | 5/2018 | Yoo | G02B 6/0091 |
| 2018/0217702 A1* | 8/2018 | Hashida | G06F 3/0445 |
| 2021/0116746 A1* | 4/2021 | Higashi | G02F 1/1333 |
| 2023/0107898 A1* | 4/2023 | Lee | H05K 5/03 361/807 |
| 2023/0209755 A1* | 6/2023 | Yun | G02F 1/133331 361/807 |

FOREIGN PATENT DOCUMENTS

| KR | 10-2020-0145934 A | 12/2020 |
|---|---|---|
| KR | 10-2230679 B1 | 3/2021 |

* cited by examiner

*Primary Examiner* — Betelhem Shewareged
(74) *Attorney, Agent, or Firm* — Birch, Stewart, Kolasch & Birch, LLP

(57) ABSTRACT

Discussed is a display apparatus capable of reducing a non-active area recognized by a user by applying a curvature portion to the entire portions of an edge area of a display panel. The display apparatus can include a display panel configured to display an image, and a cover member on the display panel and configured to protect the display panel, wherein the display panel and the cover member each includes a first curvature portion in which a side surface area is bent, and a second curvature portion in which a corner area is bent, and wherein a thickness of the corner area of the cover member is different than a thickness of the side surface area of the cover member.

25 Claims, 12 Drawing Sheets

DISPLAY APPARATUS

CROSS-REFERENCE TO RELATED APPLICATIONS

The present application claims priority to Korean Patent Application No. 10-2021-0189139, filed Dec. 28, 2021 in the Republic of Korea, the entire contents of which are hereby expressly incorporated by reference into the present application.

BACKGROUND

Field of the Invention

The present disclosure relates to a display apparatus, and more particularly, to a display apparatus capable of reducing a non-active area recognized by a user by bending the entire portions of an edge area of a display panel.

Discussion of the Related Art

A display apparatus used for displaying an image on a TV, a monitor, a smart phone, a tablet PC, and a laptop computer are provided in various types and shapes.

A liquid crystal display apparatus (LCD) among various types of the display apparatus is still in use today, and an organic light-emitting display apparatus (OLED) is also rapidly expanding in use and application.

The display apparatus includes a display panel having a plurality of light-emitting elements or liquid crystals for implementing an image, and a driving transistor for controlling the operation of each light-emitting element or liquid crystal, thereby displaying the plurality of light-emitting elements or liquid crystals according to the information to be displayed.

A liquid crystal display apparatus is not a self-light-emitting type of a display, and thus a light source such as a backlight disposed on a rear surface of a display panel to emit light is required. The backlight increases a thickness of the liquid crystal display apparatus, and imposes a limitation in implementing a display apparatus that is bendable or of various designs.

An organic light-emitting display apparatus having a self-light-emitting display element can be implemented to be thinner than a display apparatus having a separate light source such as the back light. As the organic light-emitting display apparatus does not need a separate light source it can be capable of implementing a display apparatus that is bendable or of various designs.

Such an organic light-emitting display apparatus can include a flexible display panel, and the flexible display panel can have an active area (AA) for displaying an image and a non-active area (NA) surrounding the active area and not display the image.

In the non-active area of the display panel, there may be disposed a thin-film transistor for driving a plurality of pixels disposed in the active area, and a pad portion for connecting wiring lines and a driving unit. When a size of the non-active area increases, the display apparatus becomes larger or may lead to a size of the active area becoming smaller, which results in a problem in that the portability, visibility, or readability thereof becomes poor.

Therefore, in order to minimize the non-active area, there has been developed a display apparatus capable of reducing a non-active area recognized by a user by bending a left portion and a right portion of the non-active area of the display panel.

SUMMARY OF THE DISCLOSURE

When the entire portions of an edge area of a flat display panel are bent without a cut or a shape deformation thereof, a folding can occur in a corner area of a bent portion of the edge area, which is detrimental.

Accordingly, an object of the present specification is to minimize the non-active area by bending the entire portions of the edge area of the display panel without the folding from occurring.

Technical tasks of the present disclosure are not limited to the tasks mentioned above, and other tasks to be solved not being mentioned above will be clearly understood by those skilled in the art based on the following description.

A display apparatus according to an embodiment of the present disclosure can include a display panel configured to display an image; and a cover member on the display panel and configured to protect the display panel, wherein the display panel and the cover member each can include a first curvature portion in which a side surface area is bent, and a second curvature portion in which a corner area is bent.

Further, a thickness of the corner area of the cover member can be different than a thickness of the side surface area of the cover member.

A display apparatus according to another embodiment of the present disclosure can include a display panel configured to display an image; a cover member disposed on the display panel and configured to protect the display panel; and a connection member disposed between the display panel and the cover member, wherein the display panel and the cover member can include a first curvature portion in which a side surface area is bent, and a second curvature portion in which a corner area is bent, wherein a side of the corner area of the connection member can have a protrusion portion and a recess portion.

Further embodiments of the present disclosure are provided in detail in the following description and the accompanying drawings.

According to an embodiment of the present disclosure, since the display panel includes a curvature portion that is bent in all of the side surface areas and the corner areas, it can achieve the effect of reducing the non-active area recognized by a user.

In addition, when all the side surfaces of the display panel are bent by changing the shapes of the cover member and the connection member, which are the constituents of the display apparatus, it can achieve the effect of improving the folding phenomenon occurring in the corner area.

The advantageous effects of the present disclosure are not limited to the above-mentioned effects, and other effects not mentioned above will be clearly understood by those skilled in the art based on the following description. [Update summary of Disclosure when claims are finalized].

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Figure 1:
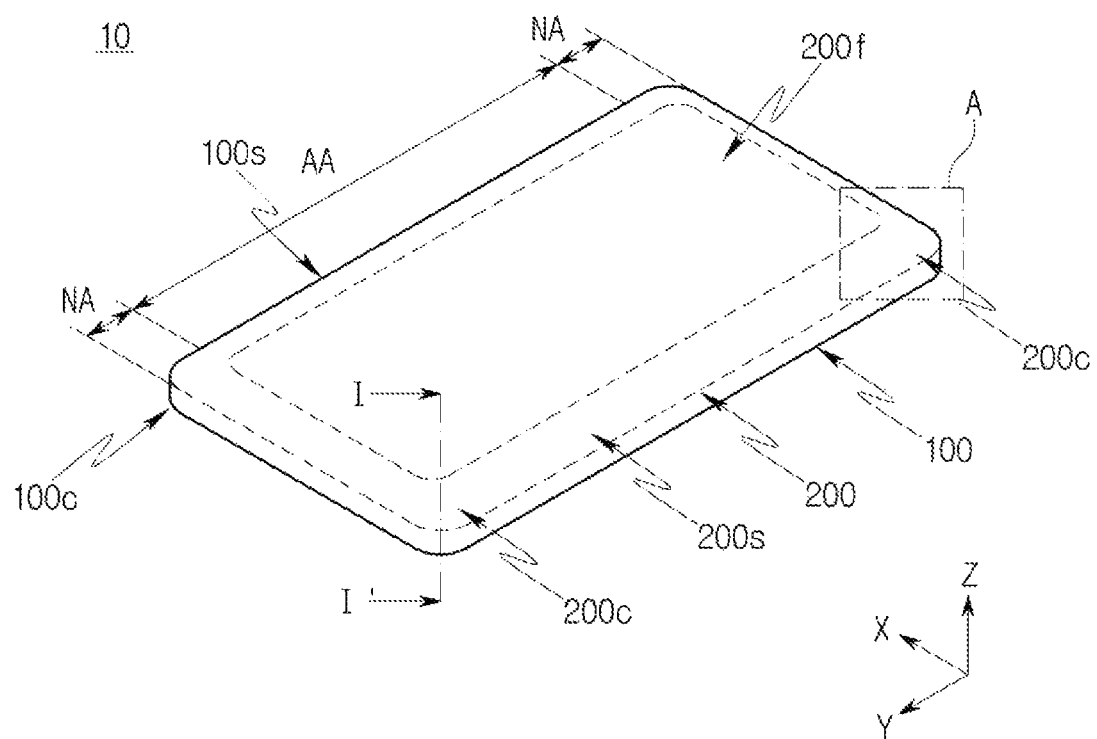
FIG. 1 is a perspective view of a display apparatus according to an embodiment of the present disclosure.

The advantages and features of the present disclosure and ways to achieve them will be apparent by making reference to embodiments as described below in detail in conjunction with the accompanying drawings. However, the disclosure is not limited to the embodiments set forth below, but can be implemented in various different forms. The following embodiments are provided only to completely disclose the disclosure and inform those skilled in the art of the scope of the disclosure, and the disclosure is defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on", "above", "below", and "next" and the like, one or more other parts can be positioned between the two parts unless the terms are used with the term "immediately" or "directly."

When an element or layer is disposed "on" other element or layer, another layer or another element can be interposed directly on the other element or therebetween.

Although the terms "first", "second" and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not necessarily limited to the size and the thickness of the component illustrated.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in in association with each other.

A display apparatus according to the present disclosure can be applied to an organic light emitting display apparatus, but is not limited thereto, and can be applied to various display apparatuses such as an LED display apparatus or a quantum dot display apparatus. All the components of each display apparatus according to all embodiments of the present disclosure are operatively coupled and configured.

Hereinafter, there will be described a display apparatus according to an embodiment of the present disclosure with reference to the accompanying drawings.

FIG. 1 is a perspective view of a display apparatus according to an embodiment of the present disclosure.

Referring to FIG. 1, a display apparatus 10 can include a cover member 100 and a display panel 200 disposed below the cover member 100. A connection member 300 (see FIG. 2) can be disposed between the cover member 100 and the display panel 200. The connection member 300 can connect or attach the cover member 100 and the display panel 200 to each other. Further, it is to be understood that the display apparatus 10 includes a plurality of gate lines, a plurality of data lines, and other elements including a plurality of thin film transistors (TFT) that are connected to a plurality of pixels and/or a plurality sub pixels or other components that enable the display apparatus 10 to properly operate.

The cover member 100 and the display panel 200 can be formed in a rectangular or square shape, and a corner area thereof can be formed to have a round shape. An upper side surface, a left side surface, a right side surface, and a lower side surface, which are the side surface areas of the cover member 100 and the display panel 200 when viewed in a plane view for example, can have a first curvature portion 200s that is bent so that its distal end is toward a downward direction (e.g., −Z axis).

In the present disclosure, the "upper portion" and "upward direction" can be in a Z-axis direction, and the "lower portion" and "downward direction" can be in a −Z-axis direction. Also, the Z-axis direction can be a direction towards an exterior of the display apparatus 10 and the −Z-axis direction can be a direction towards an interior of the display apparatus 10.

A top surface can be an upper surface, and a rear surface can be a lower surface of the cover member 100 and/or the display panel 200. Further, the positions of "upper side (upper side surface, upper side portion), lower side (lower side surface, lower side portion), left side (left side surface, left side portion), and right side (right side surface, right side portion)" can be the positions of up, down, left and right of the cover member 100 (or the display panel 200) in a plane direction (x-axis direction and y-axis direction). A side surface area can be an area including a predetermined area of the upper side, lower side, left side, and right side, and the side surface be or include a lateral surface of the cover member 100 and/or the display panel 200.

A distal end or a distal end area can be one end portion or an area starting from one end portion extending to a predetermined area, and can be expressed as one side or one portion, but is not limited thereto.

In addition, an upper left corner portion, an upper right corner portion, a lower left corner portion, and a lower right corner portion, which are the corner areas of the cover member 100 and/or the display panel 200, can include a second curvature portion 200c that is bent or curved towards the interior of the display apparatus 10.

In order to form the first curvature portion 200s and the second curvature portion 200c in the cover member 100 and/or the display panel 200, thermoforming of a flat cover member 100 can be performed first, and then forming a cover member 100 having a first curvature portion 200s and a second curvature portion 200c can be performed afterwards.

Next, a flat display panel 200 can be placed on the cover member 100 in which the first curvature portion 200s and the second curvature portion 200c are formed, and when the display panel 200 is pressed with a predetermined pressure, the display panel 200 can come in close contact with the cover member 100, and the first curvature portion 200s and second curvature portion 200c the same with those of the cover member 100 can be formed in the display panel 200.

Accordingly, the first curvature portion 200s and the second curvature portion 200c of the display panel 200 can be formed in the same areas as the first curvature portion 200s and the second curvature portion 200c of the cover member 100.

Further, the first curvature portion 200s and the second curvature portion 200c of the display panel 200 can be form to have to various radii of curvature, according to the rear surface (inner surface) shape of the first curvature portion 200s and the second curvature portion 200c of the cover member 100.

Since the first curvature portion 200s and the second curvature portion 200c of the display panel 200 are formed in the same areas as the first curvature portion 200s and the second curvature portion 200c of the cover member 100, and the radii of curvature of the first curvature portion (200s) and the second curvature portion (200c) of the display panel 200 are formed to be same as the radii of curvature of the rear surfaces of the first curvature portion (200s) and the second curvature portion (200c) of the cover member 100, the first curvature portion 200s and the second curvature portion 200c of the cover member 100 and the display panel 200 use the same reference numerals (first curvature portion: 200s, second curvature portion: 200c) in the present disclosure.

The cover member 100 can be formed of a tempered glass material, a reinforced plastic material, and a glass material, but is not limited thereto. Other transparent materials can be used. The cover member 100 can have a plurality of straight portions 100s where edges of the cover member 100 are straight, and a plurality of corner portions 100c were edges of the cover member are rounded. Each corner portions 100c can be located between adjacent straight portions 100s. In this context, the first curvature portion 200s corresponds to the straight portion 100s and the second curvature portion 200c corresponds to the corner portion 100c. In order to form the first curvature portion 200s and the second curvature portion 200c in the cover member 100, for example, the cover member 100 is placed on a lower frame in which the curvature portions are formed, and is pressed with an upper frame after applying high-temperature heat thereto, whereby the first curvature portion 200s and the second curvature portion 200c can be formed, and the way of forming the curvature portion is not limited thereto, such as being cast in a mold.

There can be disposed a connection member 300 between the cover member 100 and the display panel 200, to connect (or attach) the cover member 100 and the display panel 200 to each other.

For example, in order to fix the display panel 200 to the cover member 100, the connection member 300 can be disposed (or attached) to the entire portion of the display panel 200, and the display panel 200 on which the connection member 300 is disposed can then be disposed (or attached) at the cover member 100, so that the display panel 200 can be fixed thereby to the cover member 100.

The connection member 300 can be formed of a transparent adhesive member so that an image displayed on the display panel 200 can be displayed toward the front side through the connection member 300 and the cover member 100. For example, the connection member 300 can be formed of or include a material such as an optical clear adhesive (OCA), an optical clear resin (OCR), or a pressure sensitive adhesive (PSA), but is not limited thereto.

A flat portion 200f can be formed in a central area of the top surface of the cover member 100 and the display panel 200. The flat portion 200f can be an area that is flat without any bent area, and a distal end (or one side or one portion) of the flat portion 200f can be connected to the first curvature portion 200s and the second curvature portion 200c. In embodiments of the present disclosure, reference to being flat can refer to an area that is essentially a plane, or an area having no curvature or zero curvature.

An active area AA of the display panel 200 can be an area including the entire flat portion 200f and the first curvature portion 200s, and a portion of the second curvature portion 200c. In addition, the non-active area NA of the display panel 200 can be an area including the first curvature portion 200s and a portion of the distal end (or one side or one portion) area of the second curvature portion 200c.

Since the first curvature portion 200s and the second curvature portion 200c are bent toward an opposite direction (−Z axis) to the upper portion (Z axis) that the active area AA faces, when the display panel 200 is viewed from the front by a user, since only the area projected to the front of the non-display area AA is recognized or observed, the non-display area NA is recognized to be smaller than the actual area, thereby improving the user's visibility. In embodiments of the present disclosure, the curvature of the first curvature portion 200s and the second curvature portion 200c can direct light passing through the first curvature portion 200s and the second curvature portion 200c away from the user so that the user do not perceive the light from the first curvature portion 200s and the second curvature portion 200c.

Figure 2:
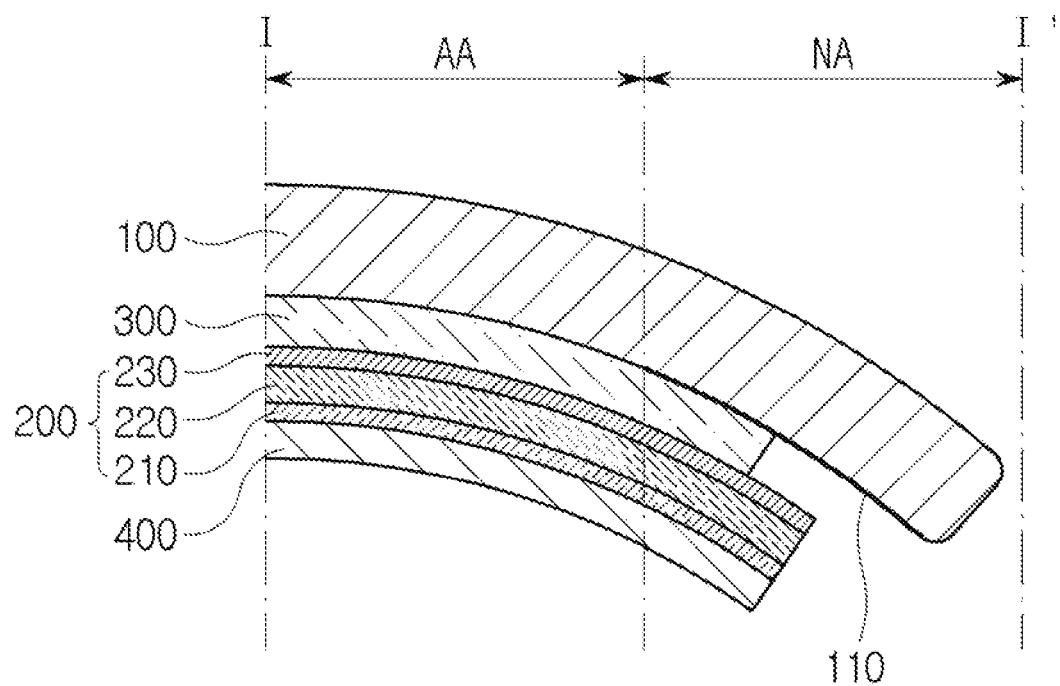
FIG. 2 is a cross-sectional view taken along line I-I' of FIG. 1.

FIG. 2 is a cross-sectional view taken along line I-I' of FIG. 1.

Referring to FIG. 2, the display apparatus 10 can include the cover member 100, the display panel 200 coupled to or below the cover member 100, and a cushion plate disposed below the display panel 200 and configured to absorb an impact applied to the display panel 200 and to radiate heat generated from the components of the display apparatus 10.

The cover member 100 can be disposed to cover a front surface of the display panel 200 to protect the display panel 200 from an external impact. The cover member 100 can include the first curvature portion 200s and the second curvature portion 200c, and thus can have a rounding shape curved toward the rear surface direction (−Z axis direction).

The cover member 100 can be disposed to cover at least a partial area of the top surface and the side surface of the display panel 200, and thus can protect from an external impact both the top surface and the side surface of the display panel 200.

An image displayed on the display panel 200 can be displayed through the top surface of the cover member 100. The cover member 100 overlaps with an active area AA that displays an image, and thus can be formed of a transparent material such as a cover glass allowing display of the image.

The front surface of the cover member 100 can include an active area AA and a non-active area NA as an area other than the active area AA. The non-active area NA can be formed along a periphery of the active area AA. The non-active area NA can be a bezel area, but is not limited thereto.

The display panel 200 can be connected or coupled below the cover member 100.

The display panel 200 can include a front portion, a bending portion, and a pad portion.

The front portion of the display panel 200 can include the active area AA in which a pixel array portion 220 is disposed, and thus an image can be displayed, and a portion of the non-active area NA surrounding the active area AA. The front portion can include the entire portion of the flat portion 200f of the display panel 200, and a portion of the first curvature portion 200s and the second curvature portion 200c.

The bending portion of the display panel 200 is a portion connected to the front portion and configured to be bent, and one side of the bending portion is connected to the front portion and the other side is bent to be disposed below the front portion. A portion, in the area of the bending portion, connected to the front portion can be formed to have a smaller width than the other area, so that the portion connected to the front portion can be easily bent. For example, the bending portion can have a smaller width by forming a groove in a semi-circular shape on one side thereof.

The pad portion of the display panel 200 can be a portion extending from the bending portion and disposed below the front portion. The pad portion can have a driving unit for driving a pixel mounted thereon, or can be connected to a flexible circuit board.

The structure of the display panel 200 is not limited the above, and can include the front portion and the pad portion without the bending portion. In the display panel 200 including the front portion and the pad portion, the flexible circuit board can be bent so that a portion of the flexible circuit board and the driving unit can be disposed below the display panel 200.

Since the connection member 300 disposed between the cover member 100 and the display panel 200 can be disposed to overlap the active area AA, it can be formed of a transparent adhesive member.

The display panel 200 disposed below the connection member 300 can include a display substrate 210, a pixel array portion 220 disposed on the display substrate 210, an encapsulation portion disposed to cover the pixel array portion 220, and an optical plate 230. The encapsulation portion can further include a touch electrode disposed thereon.

The optical plate 230 of the display panel 200 can be disposed below the connection member 300. The optical plate 230 can have a structure in which one or more functional layers are stacked, but is not limited thereto. For example, the optical plate 230 can include an anti-reflection layer, such as a polarizing film that prevents or reduces reflection of an external light to improve outdoor visibility and a contrast ratio for an image displayed on the display panel 200.

In addition, the optical plate 230 can further include a barrier layer configured to prevent penetration of moisture or oxygen. The barrier layer can be formed of a material having low moisture permeability, such as a polymer material.

The display substrate 210 disposed below the display panel 200 can serve as a base substrate of the display panel 200. The display substrate 210 can be formed of a plastic material having flexibility to become a flexible display substrate 210. Accordingly, the display apparatus 10 can have a side surface area and a corner area that can be easily bent.

For example, the display substrate can include polyimide such as a plastic material having flexibility, or can include a glass material having flexibility.

The pixel array portion 220 can correspond to an area that displays an image toward the front surface of the cover member 100 and can correspond to the active area AA. Therefore, in the cover member 100, the area corresponding to the pixel array portion 220 can be the active area AA, and an area other than the active area AA can be the non-active area NA.

The pixel array portion 220 can be implemented with various elements that display an image, and not be limited particularly.

The pixel array portion 220 can include a plurality of pixels that are arranged in a pixel area defined by signal lines on the display substrate 210 and display an image according to signals supplied to the signal lines. The signal lines can include a gate line, a data line, a pixel driving power line, and other elements that can be used to implement a display.

Each of the plurality of pixels can include a driving thin-film transistor in the pixel area, an anode electrically connected to the driving thin-film transistor, a light-emitting element layer formed on the anode, and a cathode electrically connected to the light-emitting element layer, for example.

The driving thin-film transistor can include a gate electrode, a semiconductor layer, a source electrode, a drain electrode, and other elements that can be used to implement the driving thin-film transistor. The semiconductor layer of the driving thin-film transistor can include silicon such as a-Si, poly-Si, or low-temperature poly-Si, or an oxide such as indium-gallium-zinc-oxide (IGZO) or the like, but is not limited thereto, and other semiconductors can be used.

The anode can be a pixel electrode that is individually disposed in each pixel area in a corresponding manner to an opening area provided according to a pattern shape of the pixel, and can be electrically connected to the driving thin-film transistor.

The light-emitting element layer can include, for example, an organic light-emitting element formed on the anode. The organic light-emitting element can be implemented to emit light of the same color for each pixel, for example, such as white light, or to emit light of a different color for each pixel, such as red, green, blue or white light, for example.

The cathode can be a common electrode that is commonly connected to a light-emitting element of a light-emitting element layer provided in each pixel area.

The encapsulation portion can be formed on the display substrate 210 to cover the pixel array portion 220. The encapsulation portion can prevent oxygen, moisture, or impurities from penetrating into the light-emitting element layer of the pixel array portion 220. For example, the encapsulation portion can be formed in a multilayer structure in which organic material layers and inorganic material layers are alternately stacked.

A reinforcement plate 400 can be selectively disposed below the display substrate 210. When the rigidity of the cushion plate or the display substrate 210 is high, the reinforcement plate 400 need not be disposed. The reinforcement plate 400 can be a back plate, but is not limited thereto.

The reinforcement plate 400 can be formed to have a predetermined strength and thickness to supplement the rigidity of the display substrate 210 and maintain a shape of the display substrate 210, and need not be formed in an area of the display panel 200 corresponding to the bending portion.

The cushion plate can be disposed below the reinforcement plate 400 for absorbing an impact applied to the display panel 200 and radiating heat generated from the display apparatus 10.

The cushion plate can include an adhesive layer, a cushion layer, an anti-lighting layer, and a heat radiation layer. The cushion plate is not limited thereto, and can be configured to include a porous member and an adhesive member, and can be configured to include various components.

A light shield portion 110 can be formed in a portion of the corner area and the side surface area of the edge area of the cover member 100. The light shield portion 110 can be applied with a black ink, thereby preventing various components disposed below the light shield portion 110 from being visibly recognized and blocking an external light from being incident into the display device 110.

The light shield portion 110 can prevent a distal end (or one side or one portion) area of the display panel 200 disposed below the light shield portion 110 from being visibly recognized, so that even when a fold occurs at the distal end (or one side or one portion) of the display panel 200, the fold of the distal end (or one side or one portion) of the display panel 200 may not be visually recognized by a user in front thereof.

An area in which the light shield portion 110 is disposed can be the non-active area NA. An area in which the light shield portion 110 is not disposed while the pixel array portion 220 is disposed can be the active area AA.

Since the cover member 100 forms the curvature portion through a thermoforming process with a glass or plastic material, it can be formed to have the curvature portion without the fold in the corner area, however, the display panel 200 disposed below the cover member 100 includes the display substrate 210, the pixel array portion 220, and the optical plate 230, which can be easily damaged when a heat and a high pressure are applied, and thus has a difficulty to form the curvature portion in the same way as the cover member 100.

When the display panel 200 is bent by applying a minimum pressure under a state of not applying heat thereto, the curvature portion can be formed without breakage of the components therein.

Figure 3:
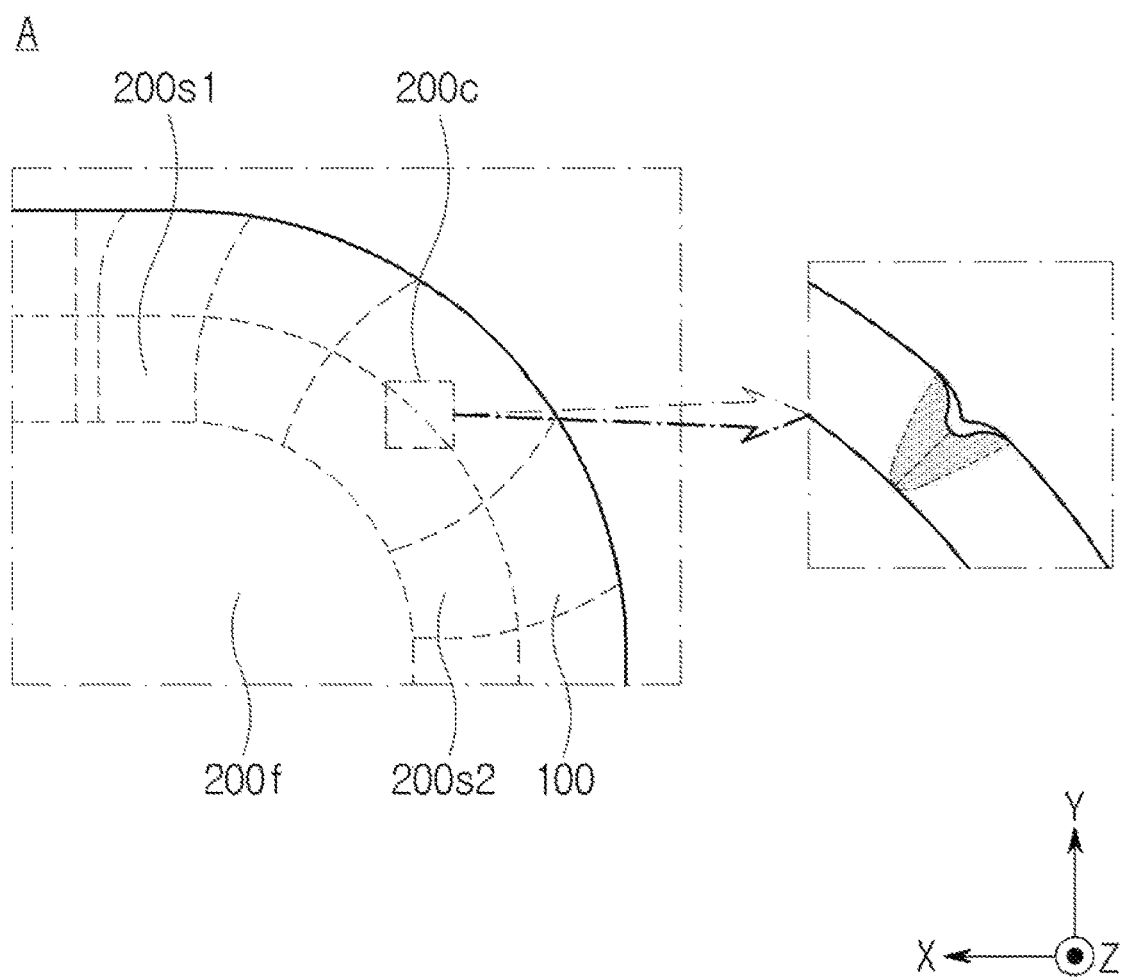
FIG. 3 is an enlarged plan view of an area "A" of FIG. 1.

FIG. 3 is an enlarged plan view of an area "A" of FIG. 1.

Referring to FIG. 3, in the display panel 200, the first curvature portion 200s1 of the upper side surface area, the first curvature portion 200s2 of the right side surface area, and the second curvature portion 200c of the upper right corner area can be continuously connected to each other and integrally disposed. For example, by bending the side surface area and the corner area together without a cut or a deformation of the flat display panel 200, the first curvature portion 200s1 of the upper side surface area, the first curvature portion 200s2 of the right side surface area, and the second curvature portion 200c of the upper right corner area can be formed.

Here, the first curvature portion 200s1 of the upper side surface area and the first curvature portion 200s2 of the right side surface area are indicated by the reference numerals of 200s1 and 200s2 for convenience of description, but elsewhere herein both the first curvature portion 200s1 of the upper side surface area and the first curvature portion 200s2 of the right side surface area are depicted by the reference numeral of 200s.

When bending the display panel 200 by applying a minimum pressure without thermoforming, the display panel 200 can be bent without any deformation, and thus there can occur the fold of the display panel 200 at the corner area where the first curvature portion 200s1 of the upper side surface area and the first curvature portion 200s2 meet. For example, the fold can occur in the second curvature portion 200c.

In order to remove the folded portion of the display panel 200 at the corner area, a scheme of cutting the entire corner area, or cutting only the folded portion from the corner area and connecting the both sides after cutting can be used.

In an embodiment of the present disclosure, there will be described a configuration in that the second curvature portion 200c is continuously connected with the first curvature portion 200s, without generating a folded portion in the corner area, and without a cut portion in the corner area, to be formed integrally.

For example, the first curvature portion 200s and the second curvature portion 200c are continuously connected and integrally formed, without cutting the corner area, by changing a bent shape or curvature radius of the corner area of the display panel 200, or by changing a shape of the connection member 300.

If the cut portion is included in the corner area of the display panel 200, the line of the cut-side is visible and thus the quality of a displayed image can deteriorate, and a signal wiring line has to be reconnected to bypass the cut-portion of the corner area, for which the wiring line design and the manufacturing method can become complicated, but the problem can be solved using a configuration of the present disclosure.

In addition, the integrally formed second curvature portion 200c and first curvature portion 200s can have an advantage in view of design. For example, the first curvature portion 200s can have a straight shape when viewed from the front (Z-axis) direction, and a round shape when viewed from a cross-sectional (X-axis or Y-axis) direction. In addition, the second curvature portion 200c has a round shape when viewed both from the front (Z-axis) direction and from the cross-sectional (X-axis or Y-axis) direction, so that the display apparatus 10 can have an aesthetically streamlined design as a whole.

Figure 4:
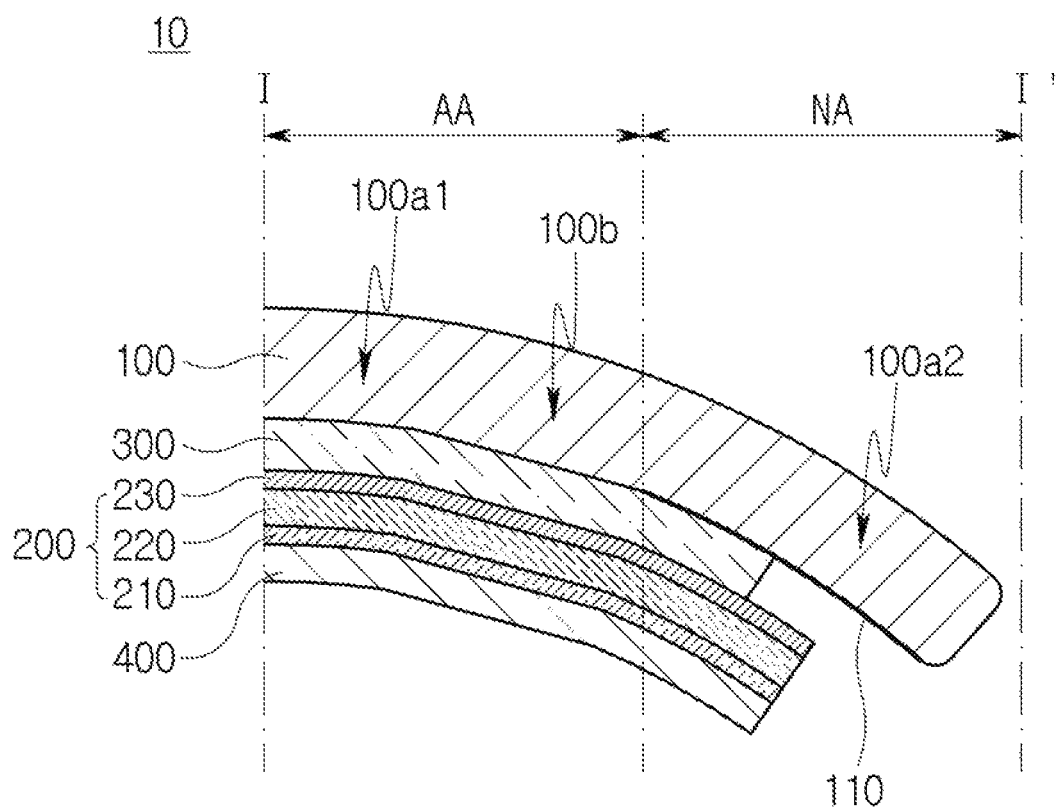
FIG. 4 is a cross-sectional view taken along line I-I' in FIG. 1, illustrating a cross-section of a cover member and a display panel according to an embodiment of the present disclosure.

FIG. 4 is a cross-sectional view taken along line I-I' in FIG. 1, illustrating a cross-section of a cover member and a display panel according to another embodiment of the present disclosure.

Referring to FIG. 4, in order to prevent the fold in the corner area of the display panel 200, the radius of curvature of the corner area of the cover member 100 can be formed to be greater than the radius of curvature of the side surface area. For example, by making a bending degree in the second curvature portion 200c which is the corner area of the display panel 200, smaller than the bending degree in the first curvature portion 200s which is the side surface area, the folding of the display panel 200 in the corner area can be improved.

Since the bending degree of the display panel 200 is determined according to the shape of the rear surface of the cover member 100, it is not necessary to adjust a shape of the top surface of the cover member 100, and by adjusting a shape of the rear surface of the cover member 100, the bending degree of the display panel 200 can be adjusted.

For example, with respect to a cross section of the corner area of the cover member 100, the top surface can have a first curvature, and the first curvature can have a curved (or round) shape, and the rear surface can have a second curvature, and the second curvature can be formed to have a mixed shape of curved portions 100a1 and 100a2 and a straight portion 100b, so that the bending degree of the display panel 200 can be reduced. Accordingly, the first curvature and the second curvature can be different. Also, as the rear surface can include a portion having straight portion 110b, the straight portion 110b can be referred to as having zero curvature.

According to an embodiment of the present disclosure, with respect to the cross section of the corner area of the cover member 100, the shape of the rear surface can include the curved portion 100a1 of the left side, the straight portion 100b of the center, and the curved portion 100a2 of the right side. The straight portion 100b can be disposed between the curved portion 100a1 of the left side and the curved portion 100a2 of the right side, and can be formed along a straight line connecting an end point of the curved portion 100a1 of the left side and a start point of the curved portion 100a2 of the right side.

With respect to the cross section of the corner area of the cover member 100, the left curved portion 100a1 and the right curved portion 100a2 of the rear surface can be formed to have a radius of curvature similar to the curved (or round) portion of the top surface, and the straight portion 100b can be formed in a straight shape by filling or augmenting to a curved portion that can be formed in the middle area and adjust a curvature of the middle area.

Accordingly, the thickness of the cover member 100 at a point where the straight portion 100b is formed can be thicker than the thicknesses of the cover member 100 at the points where the curved portions 100a1 and 100a2 are formed. In addition, the thickness of the second curvature portion 200c where the corner area of the cover member 100 is bent can be thicker than the thickness of the first curvature portion 200s where the side surface area of the cover member 100 is bent.

When the straight portion 100b is formed by filling the curved portion, the bending degree of the display panel 200 disposed below the cover member 100 is smaller than when the rear surface of the cover member 100 is formed only with a curved portion. For example, as the straight portion 100b is added thereto, the approximate (or average) radius of curvature in the second curvature portion 200c including the straight portion 100b can become larger.

As the radius of curvature of the rear surface of the cover member 100 increases, the radius of curvature of the display panel 200 disposed below the cover member 100 can also increase, and the bending degree of the display panel 200 in the corner area can decrease.

In the corner area of the cover member 100, the bending degree of the display panel 200 can be reduced as the straight portion 100b is disposed almost horizontally. Accordingly, by appropriately changing an arrangement angle and a thickness of the straight portion 100b, the display panel 200 can be bent and the fold can be prevented in the corner area.

In the corner area of the cover member 100, when the start point of the right curved portion 100a2 is formed at a position that does not overlap the display panel 200, since the display panel 200 can be not bent along the right curved portion 100a2 of the cover member 100, the bending degree can be smaller. Otherwise, in the corner area of the cover member 100, the same effect can be obtained by deleting the right curved portion 100a2, and only with the left curved portion 100a1 and the straight portion 100b.

According to an embodiment of the present disclosure, in the corner area of the cover member 100, as the fold does not occur while the top surface is formed in a round shape, it can have an advantage in view of design and of reducing the non-active area AA.

As another advantage, with respect to the corner area of the cover member 100, at the position where the straight portion 100b is formed, the top surface of the cover member 100 is formed in a round shape, and the lower surface is formed in a flat shape, so that it can have a shape such as a convex lens.

Accordingly, an image displayed in a portion of the display panel 200 disposed below the straight portion 100b of the cover member 100 can be displayed as enlarged by the cover member 100.

When a small portion displayed on the upper side surface, such as a status display window of the display panel 200, is disposed in the corner area, an image enlarged by the cover member 100 can be obtained, thereby increasing the visibility and readability of a user.

FIGS. 5A to 5E are illustrating shapes of a cover member according to an embodiment of the present disclosure.

The cover member according various embodiments is illustrated in FIGS. 5A to 5E. The structure of the cover member and the display panel is the same with FIG. 2 or FIG. 4, in which the display panel is disposed below the cover member, but which are not depicted to focus on the cover member 100.

In FIGS. 5A to 5E, the cover member is not indicated with a specific reference numeral, but as in the other drawings, the reference numeral of the cover member is "100", while reference number "200" is used for the display panel, and the description below will use the same reference numerals as those described in the other drawings.

Figure 5A:
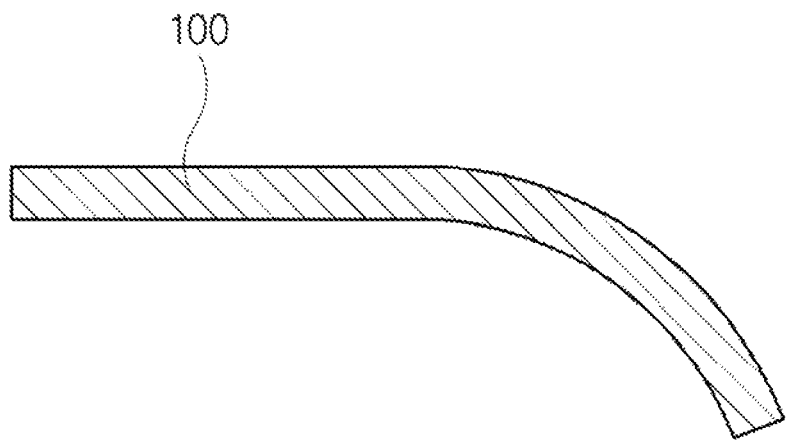
FIGS. 5A to 5E are illustrations of shapes of a cover member according to embodiments of the present disclosure.

Referring to FIG. 5A, with respect to the cross-sectional shape of the corner area of the cover member 100, both the top surface and the rear surface have a round (curved) shape, and the thickness thereof can be uniformly formed. In the embodiment of the present disclosure, the tensile stress of the display panel 200 disposed below the cover member 100 can be 32.6 Mpa, and the compressive stress thereof can be −18 Mpa. In the embodiment of the present disclosure, since the radius of curvature of the display panel 200 is formed to be smallest compared to the other embodiments, it is bent the most, and thus the compressive stress and tensile stress of the display panel 200 generated in the corner area becomes highest. Accordingly, the fold can be highly likely to occur in the corner area of the display panel 200 fixed to the cover member 100 of the first embodiment. When the both the top surface and the rear surface have the round (curved) shape, and the thickness thereof can be uniformly formed, the first curvature of the top surface and the second curvature of the rear surface can be the same.

The compressive stress and the tensile stress that cause the fold in the corner area of the display panel 200 can differ depending on the size and shape of the display panel 200, however, the fold can occur under the compressive stress at about 35 Mpa or higher and the tensile stress at about −20 Mpa or higher.

Figure 5B:
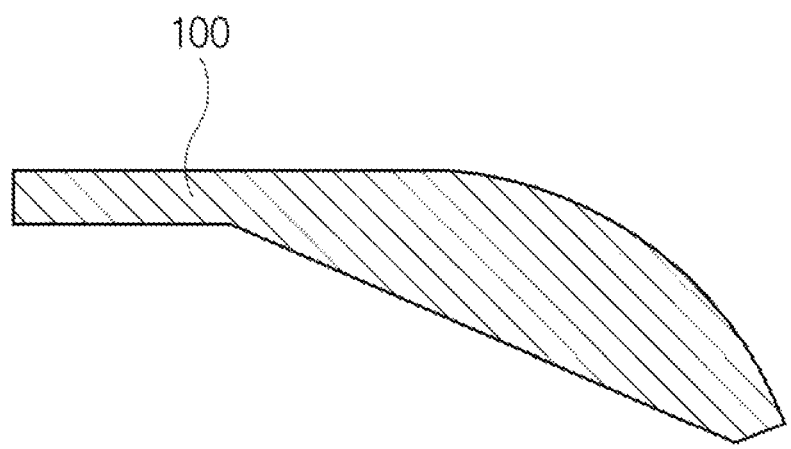

Referring to FIG. 5B, with respect to the cross-sectional shape of the corner area of the cover member 100, the top surface can have a round (curved) shape, the rear surface can have a straight shape, and the thickness can be the thickest at the center point of the straight area. In the embodiment of the present disclosure, it is indicated that the tensile stress of the display panel 200 disposed below the cover member 100 is 31.3 Mpa, and the compressive stress thereof is −17.4 Mpa. The tensile stress is reduced by 4% and the compressive stress is reduced by 3.3% than the cover member 100 when compared with FIG. 5A, so that the likelihood of occurring the fold is lower compared to FIG. 5A. When the top surface have the round (curved) shape, and the rear surface have a straight shape, the first curvature of the top surface and the second curvature of the rear surface can be different. Further, as the top surface has a curved shape and the rear surface has a straight shape, the first curvature of the top surface can be greater than the second curvature (i.e., zero curvature) of the rear surface.

Figure 5C:
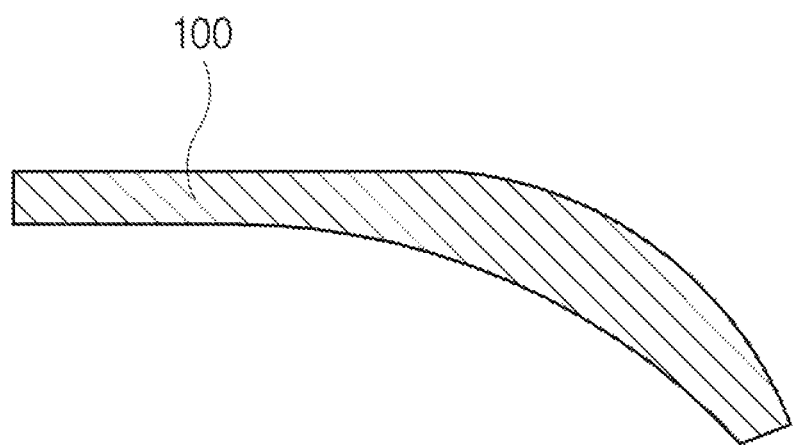

Referring to FIG. 5C, with respect to the cross-sectional shape of the corner area of the cover member 100, both the top surface and the rear surface are formed to be curved to have a round shape, and can have a concave shape formed with the greatest thickness at the center point of the corner area. In the embodiment of the present disclosure, it is indicated that the tensile stress of the display panel 200 disposed below the cover member 100 is 30.9 Mpa, and the compressive stress thereof is −17.2 Mpa, and thus the tensile stress is reduced by 5.2% and the compressive stress is reduced by 4.4%, than the cover member 100 when compared with FIG. 5A, so that the likelihood of occurring the fold is lower compared to FIGS. 5A and 5B. When the top surface have the round (curved) shape, and the rear surface have the round (curved) shape, the first curvature of top surface and the second curvature of the rear surface can be different.

Figure 5D:
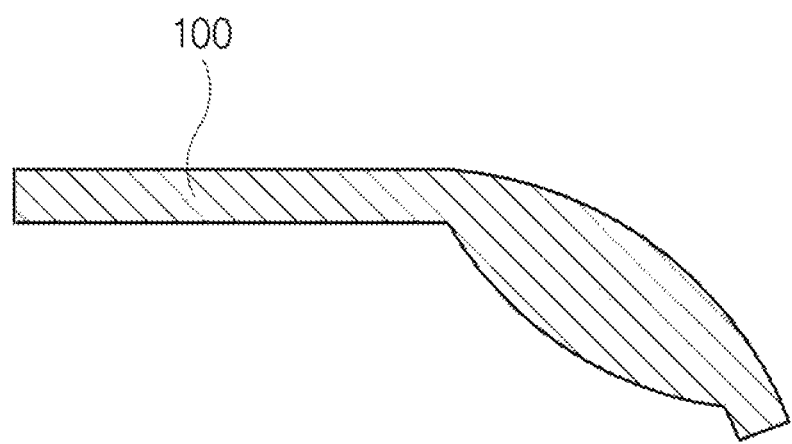

Referring to FIG. 5D, with respect to the cross-sectional shape of the corner area of the cover member 100, the top surface is formed in a round shape to be curved convex upward (i.e., towards the exterior of the display apparatus), and the rear surface has a shape convex downward (i.e., towards the interior of the display apparatus), and the center point of the corner area can have a convex shape formed with the greatest thickness. In the embodiment of the present disclosure, it is indicated that the tensile stress of the display panel 200 disposed below the cover member 100 is 32.3 Mpa, and the compressive stress thereof is −18 Mpa, and although the tensile stress is reduced by 1% than the cover member 100 of FIG. 5A, the compressive stress is the same, and so that the likelihood of occurring the fold can be similar to FIG. 5A. In this embodiment of the present disclosure, as the top surface have the round (curved) shape, and the rear surface have the round (curved) shape, the first curvature of top surface and the second curvature of the rear surface can be different or the same depending on the curvatures provided upward or downward.

Figure 5E:
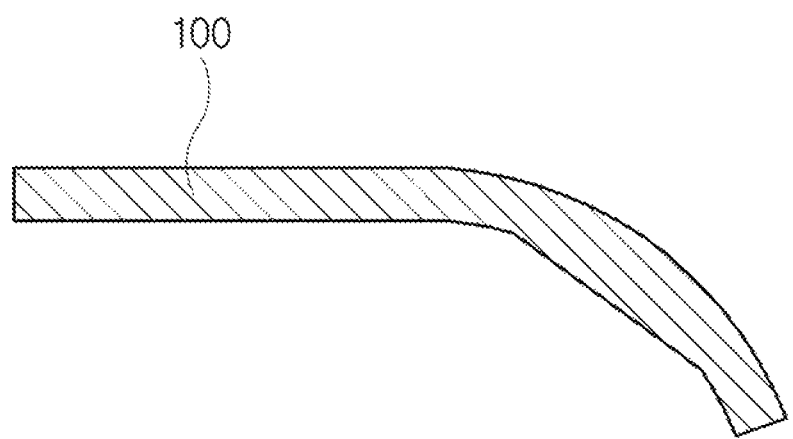

Referring to FIG. 5E, with respect to the cross-sectional shape of the corner area of the cover member 100, the top surface can have a round shape, and the rear surface can have the structure of FIG. 4 in which a straight portion and curved portions are mixed. In the embodiment of the present disclosure, it is indicated that the tensile stress of the display panel 200 disposed below the cover member 100 is 29.6 Mpa, and the compressive stress thereof is −16.4 Mpa, and the tensile stress is reduced by 9.2% and the compressive stress is reduced by 8.9% than the cover member 100 of FIG. 5A, so that this can have the lowest tensile stress and compressive stress in FIGS. 5A to 5D.

In the embodiment of the present disclosure of FIG. 5E, as the top surface has the round (curved) shape, and the rear surface has the round (curved) shape and the straight shape, the first curvature of the top surface and the second curvature of the rear surface can be both different or the same depending on a position along the top and bottom surfaces. Accordingly, a thickness of the cover member changes in going from the flat portion to the distal end of the cover member. For example, the thickness increases in going from the flat portion to the intermediate portion of the cover member, and decreases from the intermediate portion to the light shield portion of each corner portion.

The shape of the rear surface in the corner area of the cover member 100 is not limited thereto, and various rear surface shapes can be applied so that the display panel 200 have low tensile and compressive stresses.

Meanwhile, in order to prevent the fold of the corner area of the display panel 200, the shape of the distal end (or one side) of the connection member 300 can be changed in addition to changing the shape of the rear surface of the cover member 100.

Figure 6A:
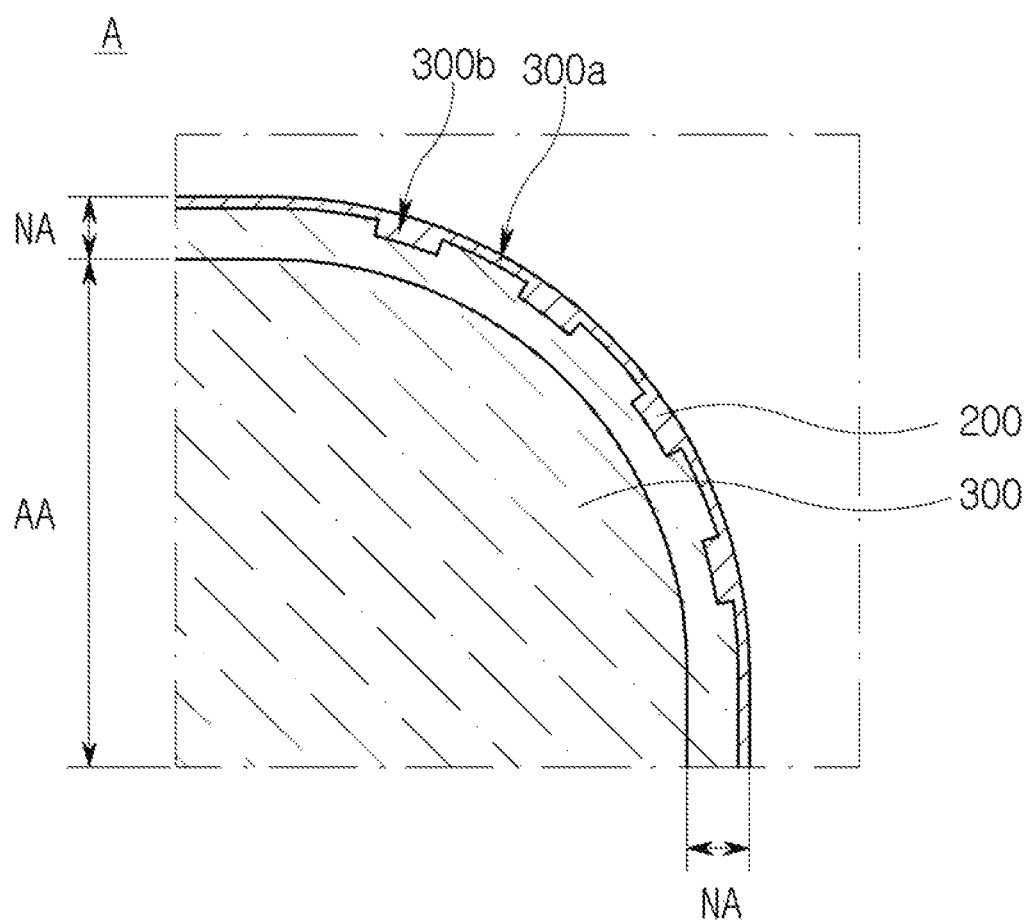
FIGS. 6A to 6C are enlarged plan views of an area "A" of FIG. 1, and are plan views illustrating a connection member according to embodiments of the present disclosure.
Figure 6B:
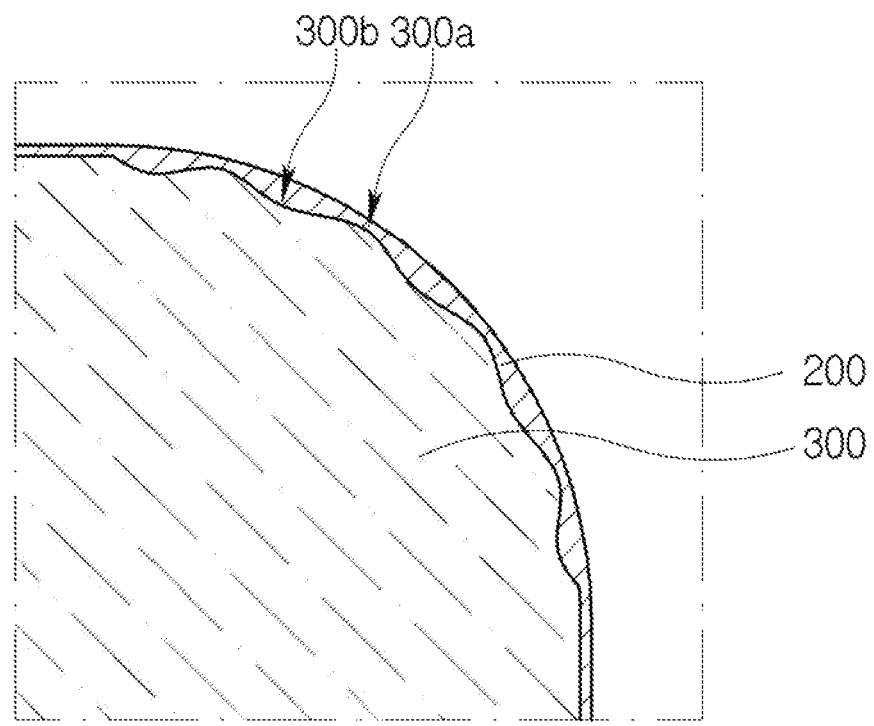
Figure 6C:
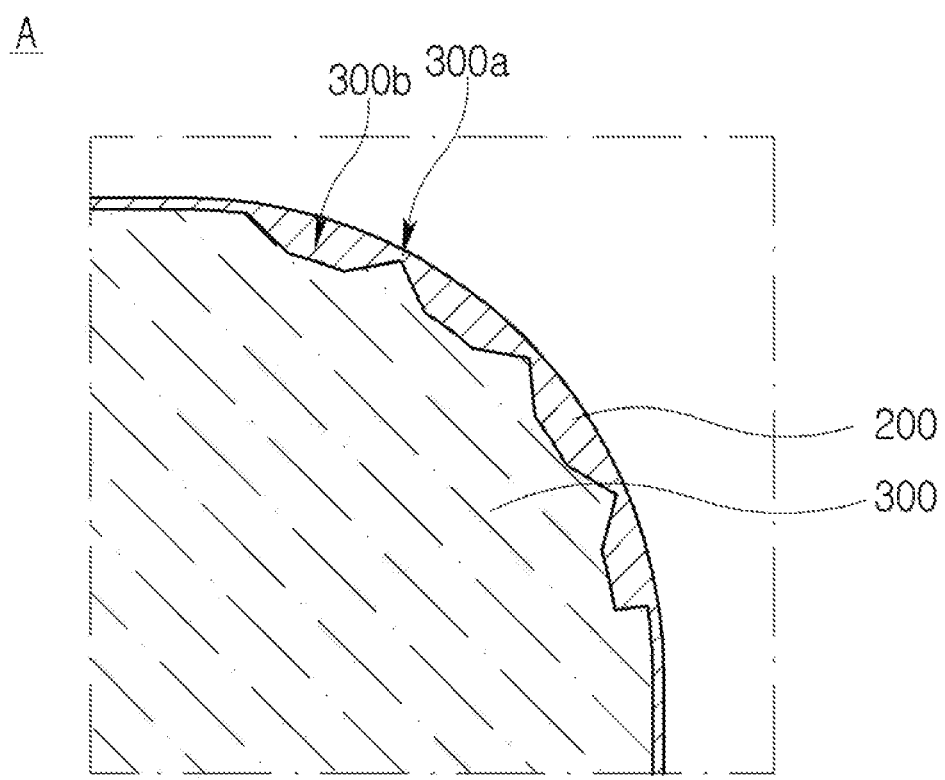

FIGS. 6A to 6C are enlarged plan views of an area "A" of FIG. 1, and are plan views illustrating a connection member according to another embodiment of the present disclosure.

A connection member 300 can be disposed between a display panel 200 and a cover member 100, and can connect (or fix or attach) the display panel 200 and the cover member 100.

The connection member 300 can be formed smaller than the display panel 200 and the cover member 100. The connection member 300 can be formed of an adhesive member having high viscosity, so that when a vertical compressive stress is applied between the connection member 300 and the display panel 200, the connection member 300 can have a lateral deformation and protrude to the outside of the display panel 200. Further, the protruding connection member 300 can flow down to a side surface of the display panel 200, causing defects in the external appearance and in functions. Therefore, the connection member 300 needs to be formed smaller than the display panel 200 and the cover member 100 in order to avoid or reduce possibility of flow down and defects in the external appearance and in functions.

When a corner area of the connection member 300 corresponding to a corner area of the display panel 200 is formed smaller than the display panel 200, since a portion of the distal end (or one side) of the corner area of the display panel 200 can be not fixed by the connection member 300, it can be bent by its own weight, so that the radius of curvature of the display panel 200 can be applied smaller than the radius of curvature of the rear surface of the cover member 100.

When the display panel 200 is bent by its own weight, the compressive stress and tensile stress applied thereto are smaller than the tensile stress and compressive stress at which the fold of the display panel 200 occurs, the display panel 200 can be bent at a level where the fold does not occur.

However, when the connection member 300 is disposed spaced apart from the distal end (or one side or one portion) of the display panel 200 by a predetermined length or more, the display panel 200 may not be fixed to the cover member 100 and can be slowly detached therefrom. In addition, when the connection member 300 is disposed spaced apart from the distal end (or one side or one portion) of the display panel 200 by a predetermined length or less, the display panel 200 is fixed to the connection member 300 without bending due to its own weight, the bending degree can be small.

Therefore, for the connection member 300, it is necessary to precisely configure a distance spaced apart from the distal end (or one side or one portion) of the display panel 200 in consideration of the attachment strength of the display panel 200 and sagging due to its own weight.

According to an embodiment of the present disclosure, there can be provided a display apparatus capable of bending the display panel 200 while preventing occurrence of a fold of the corner area of the display panel 200 or allowing the fold not to be viewed, by changing the shape of the connection member 300, instead of changing the arrangement area of the connection member 300.

Referring to FIG. 6A, when the distal end (or one side or one portion) of the corner area of the connection member 300, which corresponds to the corner area of the display panel 200, is formed to have a protrusion portion 300a and a recess portion 300b, the bending of the display panel 200 can be obtained due to its own weight without a fold thereof.

The recess portion 300b of the connection member 300 can be an area where the connection member 300 is not formed, and can be an area that does not serve a function of the connection member 300. The protrusion portion 300a can be disposed between the recess portions 300b and have a predetermined width and length, and can be an area serving a function of the connection member 300.

The display panel 200 can be fixed to the cover member 100 in the protrusion portion 300a of the connection member 300 or can sag to a certain level due to the viscosity of the protrusion portion 300a and the weight of the display panel 200. In addition, since sag of the display panel 200 due to its own weight can occur in the recess portion 300b of the connection member 300, an overall bending can occur in the corner area of the display panel 200.

Accordingly, with respect to the corner area of the cover member 100, there can be formed the display panel 200 having a radius of curvature smaller than the radius of curvature of the rear surface of the cover member 100.

The protrusion portion 300a and recess portion 300b of the connection member 300 can be formed in a quadrangular (or rectangular) shape, and when the depth and width of the recess portion 300b are adjusted, the bending of the display panel 200 due to its own weight can be adjustable.

The protrusion portion 300a and the recess portion 300b of the connection member 300 are formed in the non-active area NA of the display panel 200, and even when slight crease or fold occurs on the distal end (or one side or one portion) of the display panel 200, they are covered by the light shield portion 110 of the cover member 100, and therefore may not be visibly recognized by a user.

Further, with respect to the corner area of the cover member 100, by forming the radius of curvature of the rear surface of the cover member 100 to be small, even when a fold occurs in the display panel 200, the fold of the display panel 200 may not occur due to the recess portion 300b of the connection member 300 or the level of folding can be reduced. For example, even if the fold occurs at the distal end (or one side or one portion) of the display panel 200, the display panel 200 is not fixed in the recess portion 300b of the connection member 300 and is unfolded by the thickness of the recess portion 300b, thereby the degree of folding can be lowered.

In addition, the fold of the display panel 200 can be limited to the recess portion 300b, and the folded portion is covered by the light shield portion 110 of the cover member 100, and therefore may not be visually recognized by a user.

The protrusion portion 300a and the recess portion 300b of the connection member 300 can be configured in various shapes in consideration of the folding level and fixing force of the display panel 200. By way of example, the protrusion portion 300a and the recess portion 300b of the connection member 300 can be configured in a form of at least one of a square wave, a sinusoidal wave and a saw-tooth shaped wave, among various shapes.

FIG. 6B is a view illustrating the protrusion portion 300a and the recess portion 300b formed in the shape of a wavy curve, with respect to the distal end (or one side or one portion) of the corner area of the connection member 300.

According to the shape in which the distal end (or one side or one portion) of the display panel 200 is folded or wrinkled, the protrusion portion 300a and the recess portion 300b can be formed in a wavy curve shape. The wavy curve shape has a larger recess portion 300b than the quadrangular shape, and since the folded or wrinkled portion of the distal end (or one side or one portion) of the display panel 200 is not fixed with the connection member 300, the folded or wrinkled degree of the display panel 200 can be reduced compared to FIG. 6A.

In addition, the fold of the display panel 200 can be limited to the recess portion 300b, and the folded portion is covered by the light shield portion 110 of the cover member 100, and therefore may not be visually recognized by a user.

In FIG. 6C, with respect to the distal end (or one side or one portion) of the corner area of the connection member 300, the protrusion portion 300a is formed in a triangular shape to minimize the area thereof, and the recess portion 300b can be maximized in area by having a trapezoidal shape.

In the embodiment of the present disclosure, with respect to the corner area of the cover member 100, when the radius of curvature of the rear surface is formed to be small, the bending degree of the display panel 200 is increased, and the folded portion thereof can also be increased. Therefore, by preventing the folded portion of the display panel 200 from being fixed, the tensile stress and compressive stress of the distal end (or one side or one portion) of the display panel 200 are reduced, and thus the folded or wrinkled degree of the display panel 200 can be further reduced compared to FIG. 6B.

In addition, the fold of the display panel 200 can be limited to the recess portion 300b, and the folded portion is covered by the light shield portion 110 of the cover member 100, and therefore may not be visually recognized by a user.

A display apparatus according to an embodiment of the present disclosure will be described below.

The display apparatus according to an embodiment of the present disclosure can include a display panel configured to display an image; and a cover member disposed on the display panel and configured to protect the display panel, wherein the display panel and the cover member can include a first curvature portion in which a side surface area is bent and a second curvature portion in which a corner area is bent, and a thickness of the corner area of the cover member can be formed to be thicker than a thickness of the side surface area of the cover member.

According to some embodiments of the present disclosure, a cross-section of the second curvature portion of the cover member can have a round shape on a top surface and a straight shape on a rear surface.

According to some embodiments of the present disclosure, a cross-section of the second curvature portion of the cover member can have a round shape on a top surface and a concave or convex shape on a rear surface.

According to some embodiments of the present disclosure, a cross-section of the second curvature portion of the cover member can have a round shape on a top surface and a mixed shape of a straight portion and a curved portion on a rear surface.

According to some embodiments of the present disclosure, there can be further included a connection member disposed between the display panel and the cover member and configured to connect the display panel and the cover member, wherein the connection member can have a size smaller than the display panel and the cover member.

According to some embodiments of the present disclosure, one side of a corner area of the connection member can have a protrusion portion and a recess portion.

According to some embodiments of the present disclosure, the protrusion portion or the recess portion can have at least one of a quadrangular shape, a triangular shape, and a curve shape.

According to some embodiments of the present disclosure, the first curvature portion and the second curvature portion can be continuously connected and integrally disposed.

A display apparatus according to another embodiment of the present disclosure can include a display panel configured to display an image; a cover member disposed on the display panel and configured to protect the display panel; and a connection member disposed between the display panel and the cover member, wherein the display panel and the cover member can include a first curvature portion in which a side surface area is bent, and a second curvature portion in which a corner area is bent, wherein one side of the corner area of the connection member can have a protrusion portion and a recess portion.

A display apparatus according to another embodiment of the present invention can include a display panel configured to display an image; a cover member configured to protect the display panel, and having a flat portion at a central area of the cover member, and a plurality of straight portions and a plurality of corner portions at a periphery of the cover member; and a connection member between the display panel and the cover member, wherein the plurality of straight portions and the plurality of corner portions include curved portions that curve towards an interior of the display apparatus, wherein the cover member has a top surface facing towards an exterior of the display apparatus, and a rear surface facing towards the interior of the display apparatus, wherein the top surface of the cover member at the plurality of corner portions has a first curvature, and the rear surface of the cover member at the plurality of corner portions has a second curvature, and wherein a distal end of the connection member is not aligned with distal ends of the display panel and the cover member at the plurality of corner portions.

According to some embodiments of the present disclosure, the second curvature can be different from the first curvature.

According to some embodiments of the present disclosure, the second curvature can include a portion that has zero curvature.

According to some embodiments of the present disclosure, the first curvature can be greater than the second curvature.

According to some embodiments of the present disclosure, the first curvature and the second curvature can be the same.

According to some embodiments of the present disclosure, the first curvature can be convex towards the exterior of the display apparatus, and the second curvature can be convex towards the interior of the display apparatus.

According to some embodiments of the present disclosure, thicknesses of the plurality of corner portions can be different from a thickness of the flat portion of the cover member.

According to some embodiments of the present disclosure, the thicknesses of the plurality of corner portions can be greater than the thickness of the flat portion of the cover member.

According to some embodiments of the present disclosure, the thicknesses of the plurality of corner portions can be greater than a thickness of the plurality of straight portions of the cover member.

According to some embodiments of the present disclosure, the corner portion can include a light shield portion located at a distal end of the cover member at each corner portion, and an intermediate portion between the distal end and the flat portion of the cover member, and a thickness of the light shield portion can different than that of the intermediate portion of each corner portion of the cover member.

According to some embodiments of the present disclosure, the corner portion can include a light shield portion located at a distal end of the cover member at each corner portion and an intermediate portion between the distal end and the flat portion of the cover member, and a thickness of the cover member can change in going from the flat portion to the intermediate portion, and from the intermediate portion to the light shield portion of each corner portion.

According to some embodiments of the present disclosure, the connection member can have a corner area, and one side of the corner area of the connection member has a protrusion portion and a recess portion can be in a form of at least one of a square wave, a sinusoidal wave and a saw-tooth shaped wave.

A display apparatus according to another embodiment of the present invention can include a display panel configured to display an image; and a cover member on the display panel and configured to protect the display panel, wherein the cover member comprises a plurality of first curvature portions and a plurality of second curvature portions, the plurality of second curvature portions located at corners of the cover member, respectively, wherein thicknesses of the second curvature portions can be different from those of the plurality of first curvature portions.

According to some embodiments of the present disclosure, the thicknesses of the second curvature portions can be greater than those of the plurality of first curvature portions.

Although the embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical concept of the present disclosure, and the scope of the technical concept of the present disclosure is not limited thereto. Therefore, it should be understood that the above-described embodiments are illustrative in all aspects and do not limit the present disclosure. The protective scope of the present disclosure should be construed with respect to the following claims, and all the technical concepts in the equivalent scope thereof should be construed as falling within the scope of the present disclosure.

What is claimed is:

1. A display apparatus comprising:
   a display panel configured to display an image; and
   a cover member on the display panel and configured to protect the display panel, wherein the display panel and the cover member each comprises a first curvature portion in which a side surface area is bent, and a second curvature portion in which a corner area is bent, and wherein a thickness of the corner area of the cover member is different than a thickness of the side surface area of the cover member.

2. The display apparatus of claim 1, wherein, when viewed in a cross-section, the second curvature portion of the cover member comprises a top surface and a rear surface, and the top surface has a round shape and the rear surface has a straight shape.

3. The display apparatus of claim 1, wherein, when viewed in a cross-section, the second curvature portion of the cover member comprises a top surface and a rear surface, and the top surface has a round shape and the rear surface has at least one of a concave shape and a convex shape.

4. The display apparatus of claim 1, wherein, when viewed in a cross-section, the second curvature portion of the cover member comprises a top surface and a rear surface, and the top surface has a round shape and the rear surface has a mixed shape including a straight portion and a curved portion.

5. The display apparatus of claim 1, further comprising:
a connection member between the display panel and the cover member, and configured to connect the display panel and the cover member,
wherein the connection member has a size smaller than those of the display panel and the cover member.

6. The display apparatus of claim 5, wherein the connection member has a corner area, and one side of the corner area of the connection member has a protrusion portion and a recess portion.

7. The display apparatus of claim 6, wherein the protrusion portion or the recess portion has at least one of a quadrangular shape, a triangular shape, and a curve shape.

8. The display apparatus of claim 1, wherein the first curvature portion and the second curvature portion are continuously connected and integrally disposed.

9. The display apparatus of claim 1, wherein the thickness of the corner area of the cover member is thicker than the thickness of the side surface area of the cover member.

10. A display apparatus comprising:
a display panel configured to display an image;
a cover member on the display panel and configured to protect the display panel; and
a connection member between the display panel and the cover member,
wherein the display panel and the cover member each comprises a first curvature portion in which a side surface area is bent, and a second curvature portion in which a corner area is bent, and
wherein one side of the corner area of the connection member has a protrusion portion and a recess portion.

11. The display apparatus of claim 10, wherein the protrusion portion or the recess portion has at least one of a quadrangular shape, a triangular shape, and a curve shape.

12. A display apparatus comprising:
a display panel configured to display an image;
a cover member configured to protect the display panel, and having a flat portion at a central area of the cover member, and a plurality of straight portions and a plurality of corner portions at a periphery of the cover member; and
a connection member between the display panel and the cover member, wherein the plurality of straight portions and the plurality of corner portions include curved portions that curve towards an interior of the display apparatus,
wherein the cover member has a top surface facing towards an exterior of the display apparatus, and a rear surface facing towards the interior of the display apparatus,
wherein the top surface of the cover member at the plurality of corner portions has a first curvature, and the rear surface of the cover member at the plurality of corner portions has a second curvature, and
wherein a distal end of the connection member is not aligned with distal ends of the display panel and the cover member at the plurality of corner portions.

13. The display apparatus of claim 12, wherein the second curvature is different from the first curvature.

14. The display apparatus of claim 13, wherein the second curvature includes a portion that has zero curvature.

15. The display apparatus of claim 13, wherein the first curvature is greater than the second curvature.

16. The display apparatus of claim 12, wherein the first curvature and the second curvature are the same.

17. The display apparatus of claim 12, wherein the first curvature is convex towards the exterior of the display apparatus, and
wherein the second curvature is convex towards the interior of the display apparatus.

18. The display apparatus of claim 12, wherein thicknesses of the plurality of corner portions are different from a thickness of the flat portion of the cover member.

19. The display apparatus of claim 18, wherein the thicknesses of the plurality of corner portions are greater than the thickness of the flat portion of the cover member.

20. The display apparatus of claim 18, wherein the thicknesses of the plurality of corner portions are greater than a thickness of the plurality of straight portions of the cover member.

21. The display apparatus of claim 12, wherein each corner portion includes a light shield portion located at a distal end of the cover member at each corner portion, and an intermediate portion between the distal end and the flat portion of the cover member, and
wherein a thickness of the light shield portion is different than that of the intermediate portion of each corner portion of the cover member.

22. The display apparatus of claim 12, wherein each corner portion includes a light shield portion located at a distal end of the cover member at each corner portion and an intermediate portion between the distal end and the flat portion of the cover member, and
wherein a thickness of the cover member changes in going from the flat portion to the intermediate portion, and from the intermediate portion to the light shield portion of each corner portion.

23. The display apparatus of claim 12, wherein the connection member has a corner area, and one side of the corner area of the connection member has a protrusion portion and a recess portion in a form of at least one of a square wave, a sinusoidal wave and a saw-tooth shaped wave.

24. A display apparatus comprising:
a display panel configured to display an image; and
a cover member on the display panel and configured to protect the display panel,
wherein the cover member comprises a plurality of first curvature portions and a plurality of second curvature portions, the plurality of second curvature portions located at corners of the cover member, respectively, wherein thicknesses of the second curvature portions are different from those of the plurality of first curvature portions.

25. The display apparatus of claim 24, wherein the thicknesses of the second curvature portions are greater than those of the plurality of first curvature portions.

* * * * *